(12) United States Patent
Yamaguchi

(10) Patent No.: US 6,507,936 B2
(45) Date of Patent: Jan. 14, 2003

(54) TIMING VERIFYING METHOD

(75) Inventor: Ryuichi Yamaguchi, Osaka (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 104 days.

(21) Appl. No.: 09/838,179

(22) Filed: Apr. 20, 2001

(65) Prior Publication Data

US 2001/0034595 A1 Oct. 25, 2001

(30) Foreign Application Priority Data

Apr. 21, 2000 (JP) ........................ 2000-121303

(51) Int. Cl.$^7$ .............................................. G06F 17/50
(52) U.S. Cl. ............................................ 716/6; 703/19
(58) Field of Search ................ 716/6, 12, 14, 716/16; 703/19

(56) References Cited

U.S. PATENT DOCUMENTS 5,396,615 A  3/1995  Tani
5,754,826 A  5/1998  Gamal et al.

FOREIGN PATENT DOCUMENTS

JP   6-337904   12/1994
JP   10-240796   9/1998

*Primary Examiner*—Sara Crane
(74) *Attorney, Agent, or Firm*—McDermott, Will & Emery

(57) ABSTRACT

In accordance with a timing verifying method of the present invention, the step of calculating a variation delay time composed of a wire delay time and a cell delay time in consideration of a process varying condition is performed independently of the step of performing logic simulation of a semiconductor integrated circuit based on the calculated variation delay time.

9 Claims, 9 Drawing Sheets

TIMING VERIFYING METHOD

BACKGROUND OF THE INVENTION

The present invention relates to a method for calculating a delay time in a logic element of a semiconductor integrated circuit and, more particularly, to a timing verifying method for verifying the operational timing of a semicustom LSI such as an ASIC.

In the fabrication of semiconductor integrated circuits, microfabrication technology for elements such as transistors and wires has advanced in recent years.

With the increasing miniaturization of the elements, a delay time in a transistor contained in a logic cell (hereinafter referred to as a cell delay time) has been reduced, while the distance between wires and the width of each of the wires have been reduced. This increases the capacitance between the wires (wire-to-wire capacitance) and the resistance of each of the wires (wire resistance) so that a delay time in each of the wires (hereinafter referred to as a wire delay time) is increased accordingly. As the elements are miniaturized, the proportion of the wire delay time in an overall delay time in an LSI is increased so that accurate estimation of the wire delay time will be more and more important in the future.

When the operational timing of an LSI is verified, a delay time is calculated in consideration of processing variations produced during the fabrication process or variation in temperature, power source, or the like. If timing verification is performed in consideration of a wire delay time, the wire resistance and wire-to-wire capacitance are calculated while assuming variation in the film thickness or width of the wire, the thickness or dielectric constant of an interlayer film, or the like and the wire delay time is calculated by using the wire resistance and wire-to-wire capacitance. For the timing verification, there is used the technique for performing circuit simulation by calculating the wire resistance and wire-to-wire capacitance based on an amount of variation caused in a process varying factor which is determined by the process for fabricating an LSI and which varies at least one of the wire resistance and wire-to-wire capacitance (hereinafter referred to as an amount of process variation).

In the method disclosed in Japanese Unexamined Patent Publication HEI 10-240796 (hereinafter referred to as the conventional timing verifying method), electric characteristics including wire resistance and wire-to-wire capacitance are expressed as a function using an amount of process variation as a parameter. Specifically, a net list of wire resistances and wire-to-wire capacitances which are expressed as a function using, as a parameter, an amount of process variation such as the width or film thickness of each of wires (hereinafter referred to as a functional description net list) is used to calculate the wire resistances and wire-to-wire capacitances by reading a layout configuration of the wires. In the case of verifying the influence of the process varying factor on circuit characteristics, if the layout configuration is read once, a net list of the wire resistances and the wire-to-wire capacitances (hereinafter referred to as an RC net list) is newly generated only by inputting the parameter corresponding to the amount of process variation to the functional description net list. By performing circuit simulation using the RC net list, therefore, the influence of the process varying factor on circuit characteristics can be estimated easily.

Thus, even if the process has been changed or undergone variations, the conventional timing verifying method performs circuit simulation by inputting the parameter corresponding to the amount of process variation to the functional description net list without generating again an RC net list based on the layout configuration. This allows easy prediction of a change in circuit characteristics resulting from changes or variations in the fabrication process.

If the layout configuration has been obtained and the fabrication process is undetermined, the conventional timing verifying method allows the process for implementing desired circuit characteristics to be determined or allows the process to be optimized by repeatedly performing circuit simulation, while diversely varying the definition of the parameter in the functional description net list.

However, since it is necessary for the conventional timing verifying method to repeatedly perform circuit simulation by the number of times corresponding to the number of RC net lists which are generated on a one-by-one basis for the individual amounts of process variation set as the parameters, the time or steps required by timing verification is increased disadvantageously.

SUMMARY OF THE INVENTION

In view of the foregoing, it is therefore an object of the present invention to allow timing verification considering process variation to be performed efficiently.

A first timing verifying method according to the present invention assumes a timing verifying method for verifying an operational timing of a semiconductor integrated circuit composed of a plurality of cells having logic functions, the plurality of cells being placed in the semiconductor integrated circuit and having respective terminals connected by wires, the method comprising: a variation delay time calculating step of calculating at least two variation delay times by performing at least twice each of a first sub-step of setting, for a process varying factor which is determined by a process for fabricating the semiconductor integrated circuit and which varies at least one of resistance of each of the wires and capacitance between each of the wires and the wire adjacent thereto, an amount of process variation which is an amount of variation caused in the process varying factor, a second sub-step of calculating the resistance of the wire and the capacitance between the wires based on the amount of process variation and on a layout configuration of the wires, and a third sub-step of calculating a first delay time in the wire and a second delay time in the driving cell of the plurality of cells which drives the wire by using the resistance of the wire and the capacitance between the wires that have been calculated, while varying the amount of process variation, each of the at least two variation delay times being composed of the first delay time and the second delay time; a delay data synthesizing step of generating a synthesized delay time which determines operation characteristics of the semiconductor integrated circuit based on the at least two variation delay times; and a logic simulation step of performing logic simulation of the semiconductor integrated circuit by using the synthesized delay time.

In accordance with the first timing verifying method, the at least two variation delay times corresponding to the different amounts of process variation, i.e., to the different process varying conditions are calculated, the synthesized delay time which determines the operation characteristics of the semiconductor integrated circuit is generated based on the at least two variation delay times, and then the logic simulation of the semiconductor integrated circuit is performed by using the synthesized delay time. This allows the calculation of the variation delay times corresponding to the process varying conditions to be performed independently of the logic simulation of the semiconductor integrated circuit and allows the logic simulation to be performed by using only the synthesized delay time generated based on the at least two variation delay times. Since it is no more necessary to repeatedly perform logic simulation or circuit simulation with respect to the plurality of process varying conditions, timing verification considering process variation can be performed efficiently.

In the first timing verifying method, the delay data synthesizing step preferably includes the step of determining, as the synthesized delay time, the maximum or minimum one of the at least two variation delay times.

If the maximum one of the variation delay times is selected as the synthesized delay time, the arrangement allows the maximum delay verification of the semiconductor integrated circuit. If the minimum one of the variation delay times is selected as the synthesized delay time, on the other hand, the arrangement allows the minimum delay verification of the semiconductor integrated circuit.

Preferably, the first timing verifying method comprises, prior to the delay data synthesizing step, a mean variation delay time calculating step of calculating a third delay time in the wire and a fourth delay time in the driving cell by using the resistance of the wire and the capacitance between the wires that have been calculated based on a mean amount of process variation which is a mean amount of variation caused in the process varying factor and on the layout configuration of the wires and thereby calculating a mean variation delay time composed of the third delay time and the fourth delay time, wherein the delay data synthesizing step includes the steps of: calculating a standard deviation of the at least two variation delay times by using the mean variation delay time; and determining a sum of the standard deviation and the mean variation delay time as the synthesized delay time.

The arrangement allows precise and efficient timing verification when the plurality of process varying factors vary simultaneously.

In the first timing verifying method, the delay data synthesizing step preferably includes the steps of: calculating, for a path between flip-flops of the plurality of cells, at least two path delay times by using the at least two variation delay times, respectively; and determining, as the synthesized delay time, the variation delay time corresponding to a maximum or minimum one of the at least two path delay times.

The arrangement allows precise and efficient timing verification considering variations in path delay time resulting from process variation.

A second timing verifying method according to the present invention assumes a timing verifying method for verifying an operational timing of a semiconductor integrated circuit composed of a plurality of cells having logic functions, the plurality of cells being placed in the semiconductor integrated circuit and having respective terminals connected by wires, the method comprising: a wire length calculating step of calculating a length of each of the wires based on a layout configuration of the wires; an amount-of-variation setting step of setting, for a process varying factor which is determined by a process for fabricating the semiconductor integrated circuit and which varies at least one of resistance of each of the wires and capacitance between each of the wires and the wire adjacent thereto, an amount of process variation which is an amount of variation caused in the process varying factor based on the wire length; a wire RC calculating step of calculating, based on the amount of process variation and on the layout configuration of the wires, the resistance of the wire and the capacitance between the wires; a delay time calculating step of calculating a first delay time in the wire and a second delay time in the driving cell of the plurality of cells which drives the wire and thereby calculating a variation delay time composed of the first delay time and the second delay time; and a logic simulation step of performing logic simulation of the semiconductor integrated circuit by using the variation delay time.

In accordance with the second timing verifying method, the amount of process variation, i.e., the process varying condition is set based on the wire length, the variation delay time corresponding to the process varying condition is calculated, and then the logic simulation of the semiconductor integrated circuit is performed by using the variation delay time. This allows the calculation of the variation delay time to be performed independently of the logic simulation of the semiconductor integrated circuit and allows the logic simulation to be performed by using only the variation delay time corresponding to the process varying condition that has been set based on the wire length. Since it is no more necessary to perform logic simulation or circuit simulation with respect to the plurality of process varying conditions, timing verification considering process variation can be performed efficiently.

In the second timing verifying method, the amount-of-variation setting step preferably includes the step of setting the amount of process variation such that a variation larger than a variation produced in the resistance of the wire is produced in the capacitance between the wires if the wire length is smaller than a specified value and setting the amount of process variation such that a variation larger than a variation produced in the capacitance between the wires is produced in the resistance of the wire if the wire length is larger than the specified value.

The arrangement allows timing verification considering process variation to be performed precisely.

A third timing verifying method according to the present invention assumes a timing verifying method for verifying an operational timing of a semiconductor integrated circuit composed of a plurality of cells having logic functions, the plurality of cells being placed in the semiconductor integrated circuit and having respective terminals connected by wires, the method comprising: a wire length calculating step of calculating a length of each of the wires based on a layout configuration of the wires; a driving ability acquiring step of acquiring, from library data on the plurality of cells, a driving ability of the driving cell of the plurality of cells which drives the wire; a delay time predicting step of calculating, based on the wire length and on the driving ability, a predicted wire delay time which is a predicted value of a delay time in the wire and a predicted cell delay time which is a predicted value of a delay time in the driving cell; an amount-of-variation setting step of setting, for a process varying factor which is determined by a process for fabricating the semiconductor integrated circuit and which varies at least one of resistance of each of the wires and capacitance between each of the wires and the wire adjacent thereto, an amount of process variation which is an amount of variation caused in the process varying factor based on the predicted wire delay time and on the predicted cell delay time; a wire RC calculating step of calculating, based on the amount of process variation and on a layout configuration of the wires, the resistance of the wire and the capacitance between the wires; a delay time calculating step of calculating a first delay time in the wire and a second delay time in the driving cell by using the resistance of the wire and the capacitance between the wires that have been calculated and thereby calculating a variation delay time composed of the first delay time and the second delay time; and a logic simulation step of performing logic simulation of the semiconductor integrated circuit by using the variation delay time.

In accordance with the third timing verifying method, the amount of process variation, i.e., the process varying condition is set based on the predicted wire delay time and predicted cell delay time that have been predicted by using the wire length and the driving ability of the cell, the variation delay time corresponding to the process varying condition is calculated, and then the logic simulation of the semiconductor integrated circuit is performed by using the variation delay time. This allows the calculation of the variation delay time to be performed independently of the logic simulation of the semiconductor integrated circuit and allows the logic simulation to be performed by using only the variation delay time corresponding to the process varying condition that has been set based on the predicted wire delay time and predicted cell delay time. Since it is no more necessary to repeatedly perform logic simulation or circuit simulation with respect to the plurality of process varying conditions, timing verification considering process variation can be performed efficiently.

In the third timing verifying method, the amount-of-variation setting step preferably includes the step of setting the amount of process variation such that a variation larger than a variation produced in the resistance of the wire is produced in the capacitance between the wires if the predicted cell delay time is longer than the predicted wire delay time and setting the amount of process variation such that a variation larger than a variation produced in the capacitance between the wires is produced in the resistance of the wire if the predicted wire delay time is longer than the predicted cell delay time.

The arrangement allows timing verification considering process variation to be performed precisely.

A fourth timing verifying method according to the present invention assumes a timing verifying method for verifying an operational timing of a semiconductor integrated circuit composed of a plurality of cells having logic functions, the plurality of cells being placed in the semiconductor integrated circuit and having respective terminals connected by wires, the method comprising: a wire RC calculating step of calculating resistance of each of the wires and capacitance between each of the wires and the wire adjacent thereto based on a mean amount of process variation which is a mean amount of variation caused in a process varying factor which is determined by a process for fabricating the semiconductor integrated circuit and which varies at least one of the resistance of the wire and the capacitance between the wires and on a layout configuration of the wires; a wire length calculating step of calculating a length of each of the wires based on the layout configuration of the wires; a wire RC adjusting step of increasing the capacitance between the wires calculated in the wire RC calculating step if the wire length is smaller than a specified value and increasing the resistance of the wire calculated in the wire RC calculating step if the wire length is larger than the specified value; a delay time calculating step of calculating a first delay time in the wire and a second delay time in the driving cell of the plurality of cells which drives the wire by using the resistance of the wire and the capacitance between the wires that have been adjusted in the wire RC adjusting step and thereby calculating a variation delay time composed of the first delay time and the second delay time; and a logic simulation step of performing logic simulation of the semiconductor integrated circuit by using the variation delay time.

In accordance with the fourth timing verifying method, the resistance of the wire and the capacitance between the wires each corresponding to the mean amount of process variation, i.e., the TYP condition are calculated, the variation delay time is calculated by adjusting the resistance of the wire and the capacitance between the wires based on the wire length, and then the logic simulation of the semiconductor integrated circuit is performed by using the variation delay time. This allows the calculation of the variation delay time to be performed independently of the logic simulation of the semiconductor integrated circuit and allows the logic simulation to be performed by using only the variation delay time calculated by adjusting the resistance of the wire and the capacitance between the wires each corresponding to the TYP condition based on the wire length. Since it is no more necessary to repeatedly perform logic simulation or circuit simulation with respect to the plurality of process varying conditions, timing verification considering process variation can be performed efficiently.

In accordance with the fourth timing verifying method, the capacitance between the wires corresponding to the TYP condition is increased if the wire length is smaller than the specified value, while the resistance of the wire corresponding to the TYP condition is increased if the wire length is larger than the specified value. This allows timing verification considering process variation to be performed precisely.

In accordance with the fourth timing verifying method, the resistance of the wire and the capacitance between the wires each considering process variation are calculated by multiplying, by the specified coefficient, the resistance of the wire and the capacitance between the wires each corresponding to the TYP condition based on the wire length. Since it is no more necessary to calculate, for each of the wires, the resistance of the wire and the capacitance between the wires by setting the amount of process variation based on the wire length, timing verification considering process variation can be performed more efficiently.

DETAILED DESCRIPTION OF THE INVENTION

Before the specific embodiments are described, a semiconductor integrated circuit to which the present invention is applied (hereinafter referred to as a target circuit) will be described with reference to the drawings.

Figure 1:
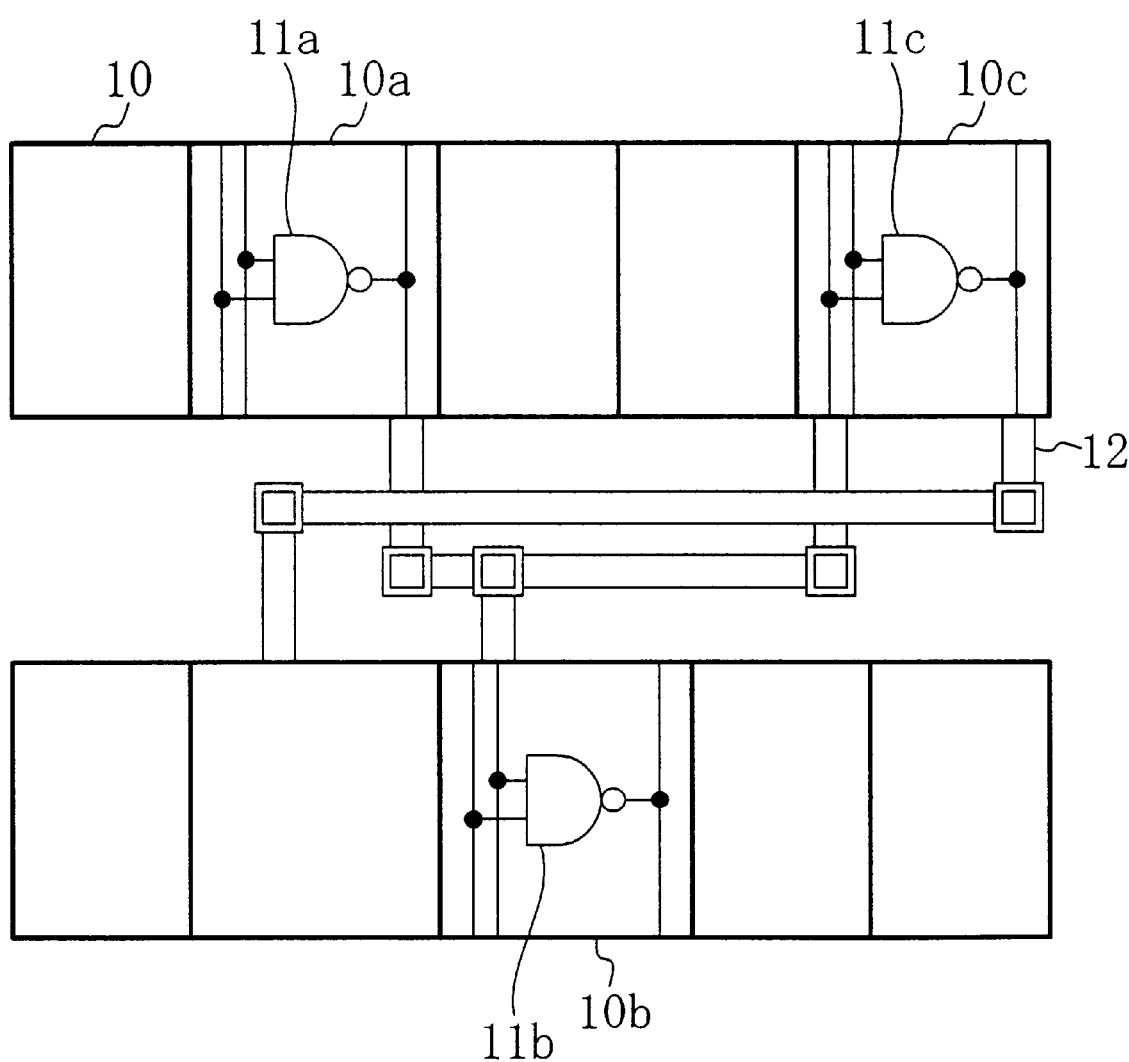
FIG. 1 shows an exemplary layout configuration of cells and wires in a circuit for which timing verification is to be performed.

FIG. 1 is a view showing an exemplary layout configuration of cells and wires in the target circuit.

As shown in FIG. 1, a plurality of cells 10 having logic functions such as a driving cell 10a, a driven cell 10b, and a driven cell 10c are placed in a plurality of columns in the target circuit. The driving cell 10a has a first element 11a, while the driven cells 10b and 10c have second and third elements 11b and 11c, respectively. The plurality of cells 10 have respective input/output terminals (not shown) connected to each other by wires 12.

Figure 2:
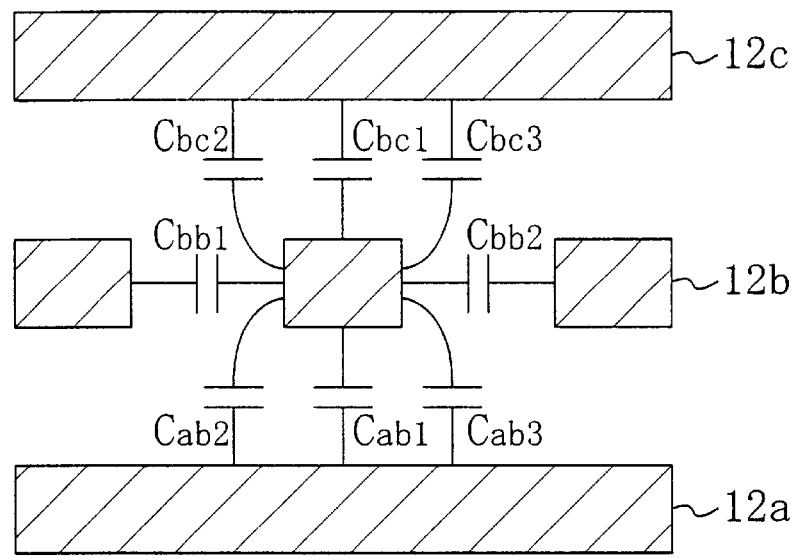
FIG. 2 is a diagram showing capacitances generated between wires in the target circuit.

FIG. 2 is a diagram showing capacitances generated between wires in the target circuit.

As shown in FIG. 2, wires 12 in the target circuit are composed of, e.g., a first-layer wire 12a, a second-layer wire 12b, and a third-layer wire 12c. The capacitance $C_{ab1}$ is generated between the upper surface of the first-layer wire 12a and the lower surface of the second-layer wire 12b. The capacitances $C_{ab2}$ and $C_{ab3}$ are generated between the upper surface of the first-layer wire 12a and the respective side surfaces of the second-layer wire 12b. The capacitances $C_{bb1}$ and $C_{bb2}$ are generated between the adjacent side surfaces of the second-layer wire 12b. The capacitance $C_{bc1}$ is generated between the upper surface of the second-layer wire 12b and the lower surface of the third-layer wire 12c. The capacitances $C_{bc2}$ and $C_{bc3}$ are generated between the side surfaces of the second-layer wire 12b and the lower surface of the third-layer wire 12c. In short, wire-to-wire capacitance changes depending on the positional relationship between wires adjacent to each other in a vertical or horizontal direction and on variation in the width of each of the wires or in the film thickness thereof, i.e., on variation in the distance between the wires. If the width or film thickness of each of the wires varies, wire resistance also changes.

Figure 3:
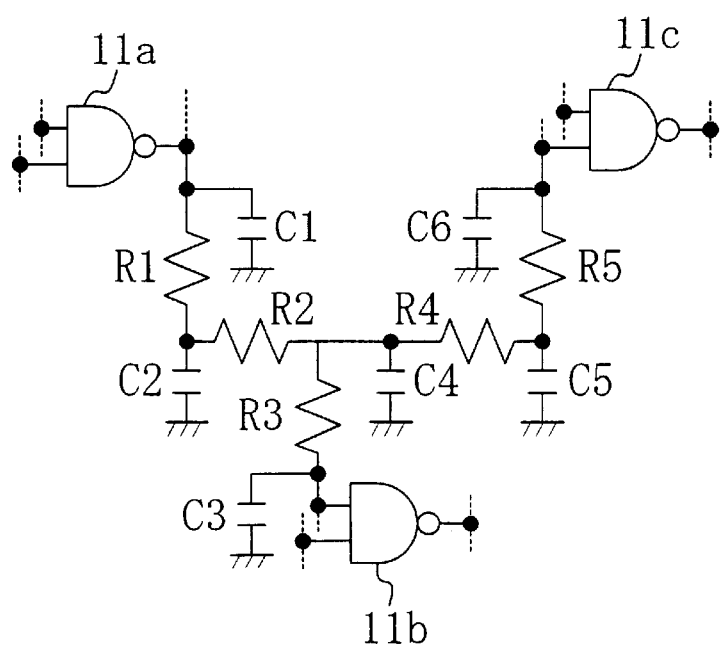
FIG. 3 is a diagram of the target circuit to which wire resistances and wire-to-wire capacitances calculated based on the layout configuration have been added.

FIG. 3 shows a diagram of the target circuit to which wire resistances and wire capacitances calculated based on the layout configuration have been added.

As shown in FIG. 3, the wires connecting the first, second, and third elements 11a, 11b, and 11c have the resistances R1, R2, R3, R4, and R5, while the capacitances C1, C2, C3, C4, C5, and C6 are present between the wires. The circuit diagram to which the wire resistances and wire capacitances have been added shown in FIG. 3 can be expressed by using a SPF (Standard Parasitic Format) which is a form for expressing RC data defined in the OVI (Open Verilog Initiative).

Figure 4:
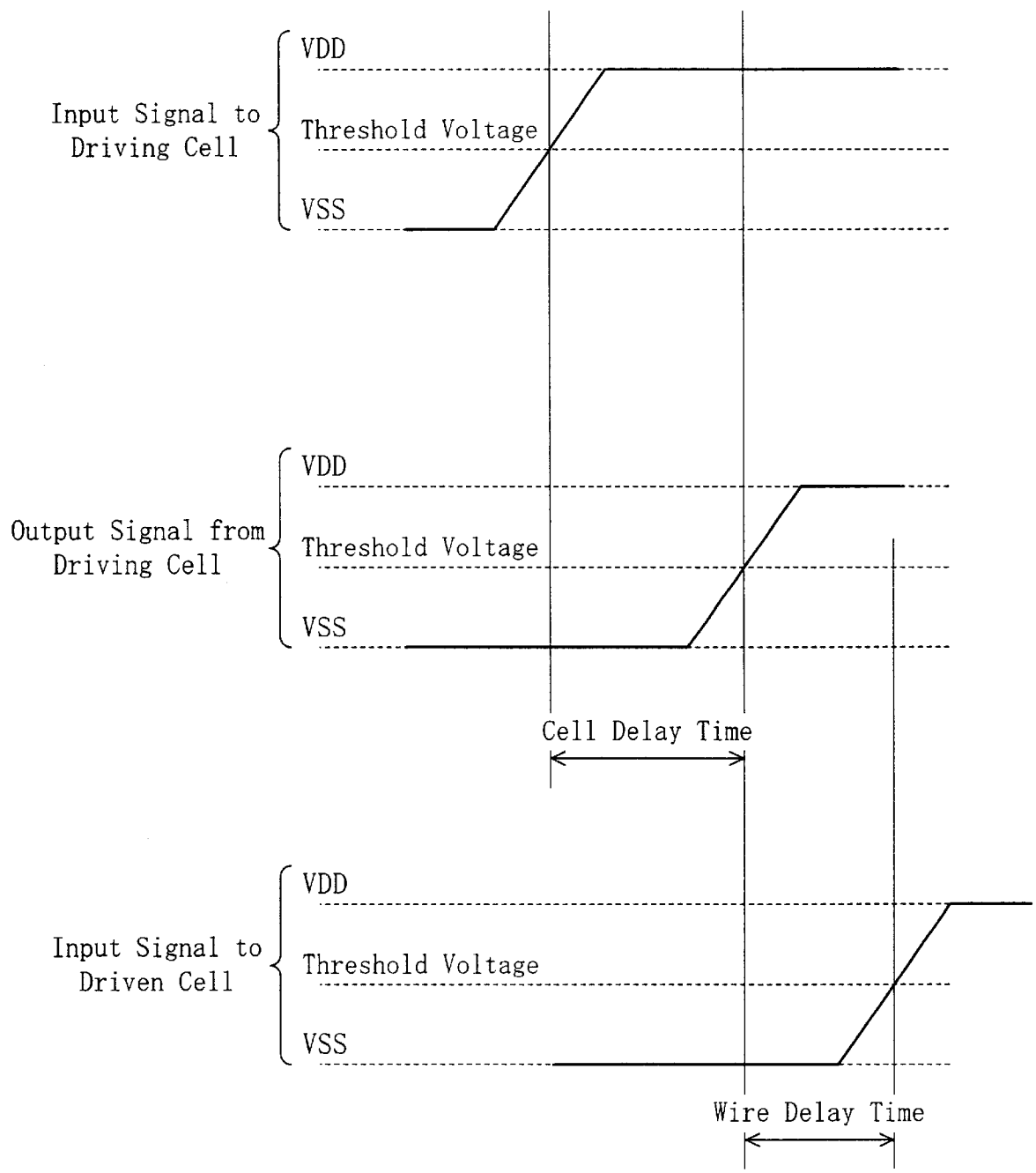
FIG. 4 is a diagram showing the definition of a delay time in the target circuit.

FIG. 4 is a diagram showing the definition of a delay time in the target circuit.

As shown in FIG. 4, the present specification defines, as a cell delay time, a time elapsed from the time at which an input signal to the driving cell reaches a threshold voltage to the time at which an output signal from the driving cell reaches a threshold voltage and defines, as a wire delay time, a time elapsed from the time at which the output signal from the driving cell reaches a threshold voltage to the time at which an input signal to any of the driven cells reaches a threshold voltage, i.e., a time required by the output signal from the driving cell to reach an input terminal of any of the driven cells. The cell delay time and the wire delay time can be expressed by using a SDF (Standard Delay Format) which is a form for expressing delay data defined in the OVI.

EMBODIMENT 1

A timing verifying method according to a first embodiment of the present invention, specifically a timing verifying method for verifying the operational timing of a semiconductor integrated circuit in which a plurality of cells having logic functions and respective terminals connected by wires are placed (hereinafter referred to as a target circuit) will be described with reference to FIG. 5.

Figure 5:
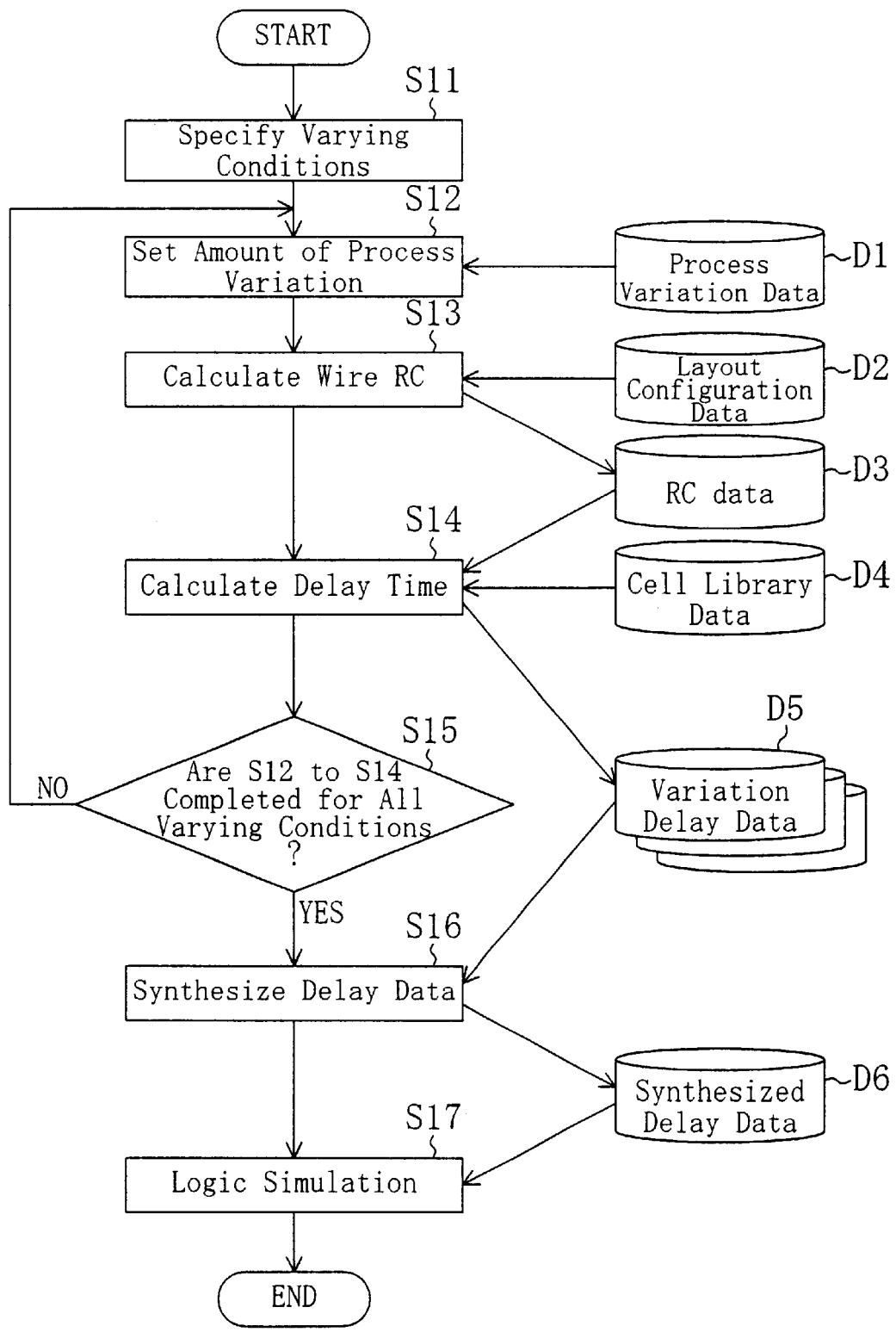
FIG. 5 is a flow chart of a timing verifying method according to a first embodiment of the present invention.

FIG. 5 is a flow chart of the timing verifying method according to the first embodiment.

First, in Step S11 (varying condition specifying step), conditions for varying the process for fabricating the target circuit, i.e., process varying conditions, are specified. Specifically, of process variation data D1 prepared in advance (data described in a process rule book), data used to calculate wire resistances and wire-to-wire capacitances is specified. In the process variation data D1, the mean value, maximum value (e.g., the mean value +3σ), and minimum value (e.g., the mean value −3σ) of an amount of process variation for each of process varying factors which varies at least one of the wire resistance and wire-to-wire capacitance, e.g., the thickness or width of each of the wires, the thickness or dielectric constant of an interlayer film, or the like are stored. It is to be noted that σ represents the standard deviation of an amount of process variation.

When the process varying conditions are specified in Step S11, the first embodiment specifies the maximum or minimum value of the amount of process variation for each of the process varying factors.

The first embodiment specifies at least two process varying conditions in Step S11 and thereby allows the calculation of at least two delay times which correspond to the respective process varying conditions in the subsequent step. For example, the maximum value of the amount of process variation is specified for each of the process varying factors in specifying the first process varying condition and the minimum value of the amount of process variation is specified for each of the process varying factors in specifying the second process varying condition.

Next, in Step S12 (amount-of-variation setting step), the amount of process variation corresponding to each of the process varying conditions specified in Step S11 is read from the process variation data D1 to be set.

Next, in Step S13 (wire RC calculating step), a layout configuration of wires (wires connecting cells) is read from the layout configuration data D2 in which the layout configuration of wires and a layout configuration of transistors in the cells are stored such that the wire resistance and wire-to-wire capacitance corresponding to each of the process varying conditions specified in Step S11 are calculated by varying the cross-sectional shape of the wire or the like based on the amount of process variation set in step S12 and the calculated wire resistance and wire-to-wire capacitance are stored as RC data D3.

In the first embodiment, Step S13 is performed with respect to each of the wires in the target circuit.

Next, in Step S14 (delay time calculating step), a wire delay time and a cell delay time are calculated by using the wire resistance and wire-to-wire capacitance stored in the RC data D3, the driving ability of the cell stored in cell library data D4, and the like, whereby a variation delay time composed of the wire delay time and the cell delay time is calculated and stored as variation delay data D5.

Next, in Step S15 (reiterating step), it is judged whether or not Steps S12 to S14 have been performed with respect to all the process varying conditions specified in Step S11 and, if Steps S12 to S14 have been completed for all the process varying conditions, the subsequent Step S16 is initiated. If Steps S12 to S14 have not been completed for all the process varying conditions, Steps S12 to S14 are performed again.

Thus, in the first embodiment, the at least two variation delay times corresponding to the at least two process varying conditions specified in Step S11 are stored as the variation delay data D5.

Next, in Step S16 (delay data synthesizing step), a synthesized delay time which determines the operation characteristics of the target circuit is generated based on the at least two variation delay times stored as the variation delay data D5 and the synthesized delay time is stored as synthesized delay data D6.

Specifically, the first embodiment determines, as the synthesized delay time, the maximum or minimum one of the variation delay times stored as the variation delay data D5.

Next, in Step S17 (logic simulation step), logic simulation of the target circuit is performed by using the synthesized delay time stored as the synthesized delay data D6 in order to verify the operational timing of the target circuit, i.e., to verify whether or not the target circuit operates normally. If the maximum one of the variation delay times has been selected as the synthesized delay time in Step S16, the maximum delay verification of the target circuit can be performed. If the minimum one of the variation delay times has been selected as the synthesized delay time in Step S16, the minimum delay verification of the target circuit can be performed.

Thus, the first embodiment calculates the at least two variation delay times corresponding to the different amounts of process variation, i.e., to the different process varying conditions, generates the synthesized delay time which determines the operation characteristics of the target circuit based on the at least two variation delay times, and then performs logic simulation of the target circuit by using the synthesized delay time. This allows the calculation of the variation delay times corresponding to the process varying conditions to be performed independently of the logic simulation of the target circuit and allows the logic simulation to be performed by using only the synthesized delay time generated based on the at least two variation delay times. Since it is no more necessary to repeatedly perform logic simulation or circuit simulation with respect to a plurality of process varying conditions, timing verification considering process variation can be performed efficiently.

EMBODIMENT 2

A timing verifying method according to a second embodiment of the present invention, specifically a timing verifying method for verifying the operational timing of a target circuit will be described with reference to FIG. 6.

Figure 6:
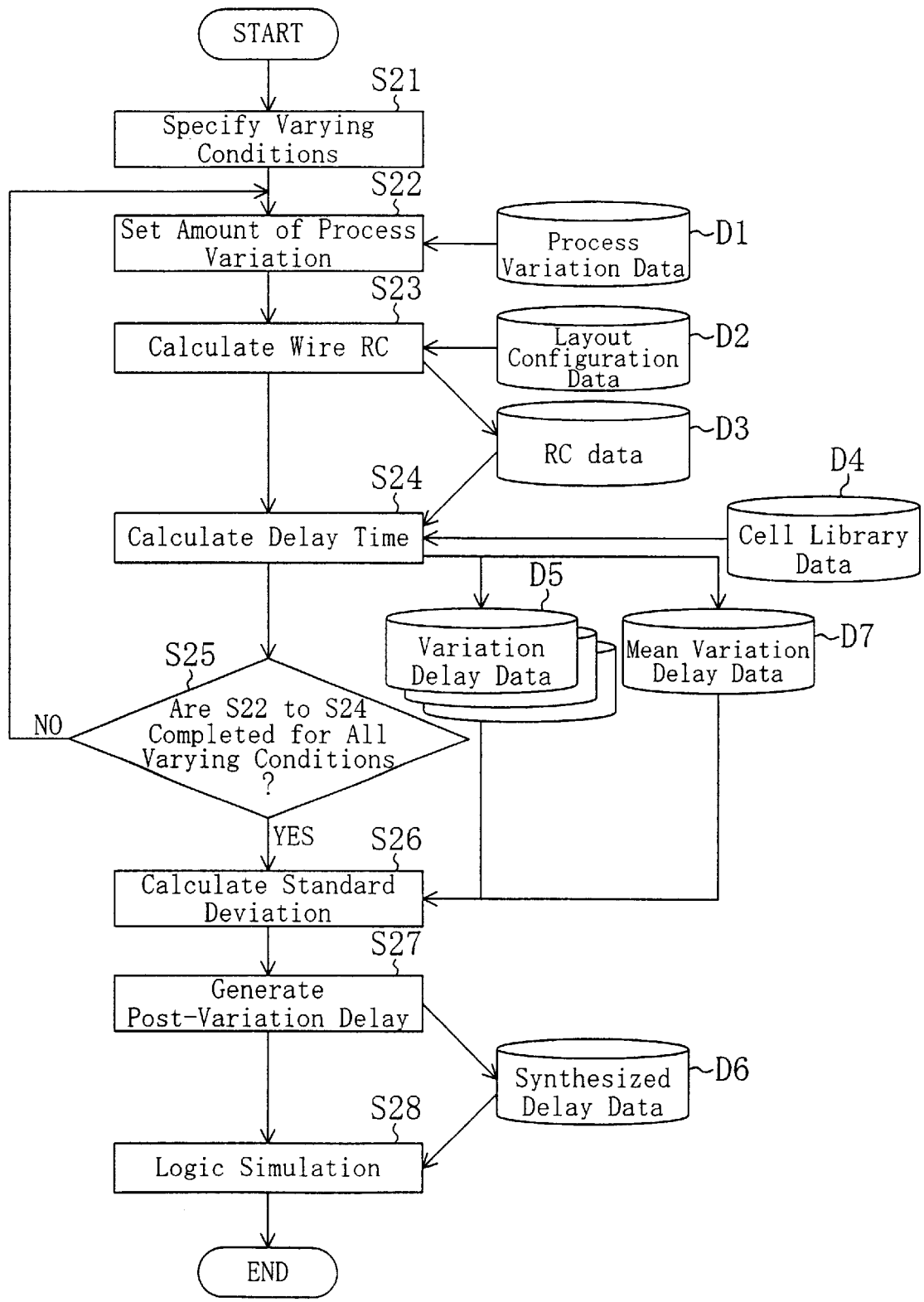
FIG. 6 is a flow chart of a timing verifying method according to a second embodiment of the present invention.

FIG. 6 is a flow chart of the timing verifying method according to the second embodiment.

First, in Step S21 (varying condition specifying step), conditions for varying the process for fabricating the target circuit, i.e., process varying conditions, are specified, similarly to Step S11 of the first embodiment. Specifically, data used to calculate wire resistances and wire-to-wire capacitances of process variation data D1 prepared in advance is specified.

Step S21 is different from Step S11 of the first embodiment in that, when the process varying conditions are specified, the maximum value of an amount of process variation (hereinafter referred to as the maximum amount of process variation) or the minimum value thereof (hereinafter referred to as the minimum amount of process variation) is specified for an arbitrary one of the plurality of process varying factors and that a mean value of the amount of process variation (hereinafter referred to as a mean amount of process variation) is specified for each of the other process varying factors. At this time, each of the plurality of process varying factors is selected in turn as the process varying factor for which the maximum amount of process variation or the minimum amount of process variation is specified. It is to be noted that the maximum process variation, the minimum amount of process variation, and the mean amount of process variation differ from one process varying factor to another.

Specifically, if the film thickness and width of each of the wires and the thickness and dielectric constant of an interlayer film are used as the process varying factors in the second embodiment, the maximum amount of process variation or the minimum amount of process variation is specified for the film thickness of the wire in specifying the first process varying condition, while the mean amount of process variation is specified for each of the other process varying conditions. In specifying the second process varying condition, the maximum amount of process variation or the minimum amount of process variation is specified for the width of the wire, while the mean amount of process variation is specified for each of the other process varying factors. In specifying the third process varying condition, the maximum amount of process variation or the minimum amount of process variation is specified for the thickness of the interlayer film, while the mean amount of process variation is specified for each of the other process varying factors. In specifying the fourth process varying condition, a maximum amount of process variation or a minimum amount of process variation is specified for the dielectric constant of an interlayer film, while a mean amount of process variation is specified for the other process varying factors.

Next, in Step S22 (amount-of-variation setting step), the amount of process variation corresponding to each of the process varying conditions specified in Step S21 is read from the process variation data D1 to be set, similarly to Step S12 of the first embodiment.

Next, in Step S23 (wire RC calculating step), a layout configuration of the wires (wires connecting the cells) is read from layout configuration data D2, similarly to Step S13 of the first embodiment. Then, the wire resistance and wire-to-wire capacitance corresponding to each of the process varying conditions specified in Step S21 are calculated by varying the cross-sectional shape of the wire or the like based on the amount of process variation set in Step S22, and the calculated wire resistance and wire-to-wire capacitance are stored as RC data D3.

In the second embodiment, Step S23 is performed with respect to each of the wires in the target circuit.

Next, in Step S24 (delay time calculating step), a wire delay time and a cell delay time are calculated by using the wire resistance and wire-to-wire capacitance stored in the RC data D3, the driving ability of the cell stored in cell library data D4, and the like, similarly to Step S14 of the first embodiment, whereby a variation delay time composed of the wire delay time and the cell delay time is calculated and stored as variation delay data D5.

Next, in Step S25 (reiterating step), it is judged whether or not Steps S22 to S24 have been performed with respect to all the process varying conditions specified in Step S21, similarly to Step S15 of the first embodiment. If Steps S22 to S24 have been completed for all the process varying conditions, the subsequent Step S26 is initiated. If Steps S22 to S24 have not been completed for all the process varying conditions, Steps S22 to S24 are performed again.

Step S25 is different from Step S15 of the first embodiment in that the wire delay time and the cell delay time are calculated in Step S24 by using the wire resistance and wire-to-wire capacitance calculated in Step S23 by setting the mean amount of process variation for each of the process varying factors in Step S22 after the processes of Steps S22 to S24 have been performed with respect to all the process varying conditions and before the subsequent Step S26 is initiated, whereby a mean variation delay time composed of the wire delay time and the cell delay time is calculated and stored as mean variation delay data D7. Alternatively, the mean variation delay time may also be calculated and stored before Step S25 is performed, i.e., before the processes of Steps S22 to S24 are performed with respect to the process varying conditions specified in Step S21.

Thus, in the second embodiment, the variation delay times corresponding to the process varying conditions specified in Step S21 are stored as the variation delay data D5 and the mean variation delay time corresponding to an average process varying condition (hereinafter referred to as a TYP condition) is stored as the mean variation delay data D7.

Next, in Step S26 (standard deviation calculating step), the standard deviation of the at least two variation delay times stored as the variation delay data D5 is calculated by using the mean variation delay time stored as the mean variation delay data D7.

Specifically, if the film thickness and width of each of the wires and the thickness and dielectric constant of an interlayer film are used as the process varying factors in the second embodiment, the standard deviation of the variation delay times is calculated in accordance with the following equation.

Standard Deviation $\sigma$
=((First Variation Delay time T1—Mean Variation Delay time T0)$^2$
+(Second Variation Delay time T2—Mean Variation Delay time T0)$^2$
+(Third Variation Delay time T3—Mean Variation Delay time T0)$^2$
+(Fourth Variation Delay time T4—Mean Variation Delay time T0)$^2$)$^{0.5}$ It is to be noted that the first to fourth variation delay times T1 to T4 correspond to the first to fourth process varying conditions (see Step S21).

Next, in Step S27, the sum of the standard deviation calculated in Step S26 and the mean variation delay time stored as the mean variation delay data D7 is determined as a synthesized delay time when the plurality of process varying factors vary simultaneously and the synthesized delay time is stored as synthesized delay data D6.

Next, in Step S28 (logic simulation step), logic simulation of the target circuit is performed by using the synthesized delay time stored as the synthesized delay data D6 in order to verify whether or not the target circuit operates normally, similarly to Step S17 of the first embodiment.

Thus, the second embodiment achieves the following effect in addition to the effects achieved by the first embodiment.

Since the second embodiment calculates the standard deviation of the at least two variation delay times by using the mean variation delay time corresponding to the TYP condition, determines the sum of the standard deviation and the mean variation delay time as the synthesized delay time, and then performs the logic simulation of the target circuit by using the synthesized delay time, timing verification when the plurality of process varying factors vary simultaneously can be performed precisely and efficiently. Specifically, timing verification can be performed without unnecessarily increasing a margin in contrast to the case where the variation delay times when the maximum or minimum amount of process variation is set for each of the process varying factors are used for the logic simulation. In addition, the timing verification can be performed in a processing time shorter than in the case where the variation delay times when random numbers generated by Monte Carlo simulation are set as the amounts of process variation are used for the logic simulation.

EMBODIMENT 3

A timing verifying method according to a third embodiment of the present invention, specifically a timing verifying method for verifying the operational timing of a target circuit will be described with reference to FIG. 7.

Figure 7:
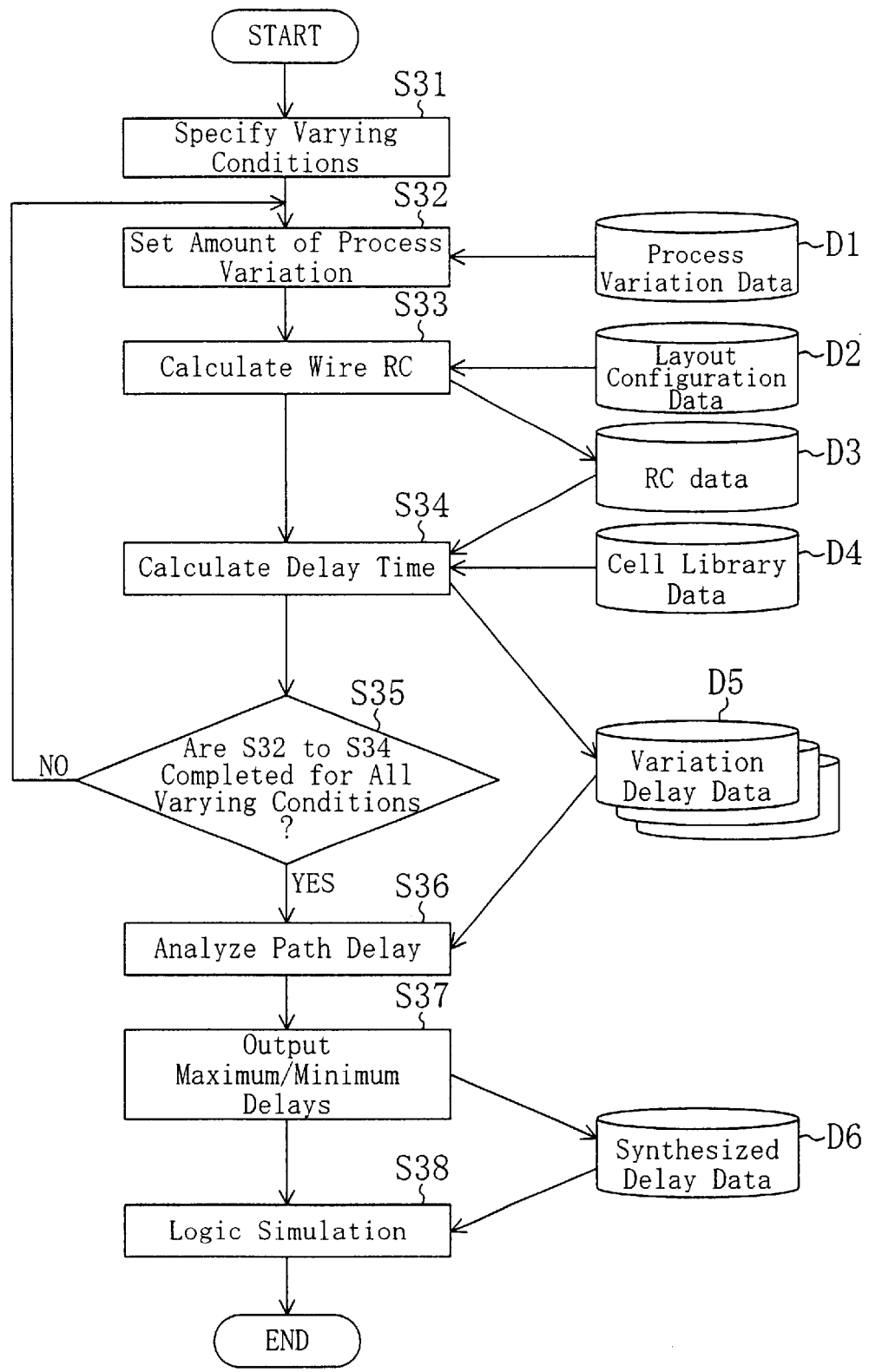
FIG. 7 is a flow chart of a timing verifying method according to a third embodiment of the present invention.

FIG. 7 is a flow chart of the timing verifying method according to the third embodiment.

First, in Step S31 (varying condition specifying step), conditions for varying the process for fabricating the target circuit, i.e., process varying conditions are specified, similarly to S11 of the first embodiment. Specifically, data used to calculate the wire resistance and wire-to-wire capacitance of process variation data D1 prepared in advance is specified.

Next, in Step S32 (amount-of-variation setting step), the amount of process variation corresponding to each of the process varying conditions specified in Step S31 is read from the process variation data D1 to be set, similarly to Step S12 of the first embodiment.

Next, in Step S33 (wire RC calculating step), a layout configuration of wires (wires connecting the cells) is read from layout configuration data D2, similarly to Step S13 of the first embodiment. Then, the wire resistance and wire-to-wire capacitance corresponding to each of the process varying conditions specified in Step S31 are calculated by varying the cross-sectional shape of the wire or the like based on the amount of process variation specified in Step S32, and the calculated wire resistance and wire-to-wire capacitance are stored as RC data D3.

In the third embodiment, Step S33 is performed with respect to each of the wires in the target circuit.

Next, in Step S34 (delay time calculating step), a wire delay time and a cell delay time are calculated by using the wire resistance and wire-to-wire capacitance stored in the RC data D3, the driving ability of the cell stored in cell library data D4, and the like, similarly to Step S14 of the first embodiment, whereby a variation delay time composed of the wire delay time and the cell delay time is calculated and stored as variation delay data D5.

Next, in Step S35 (reiterating step), it is judged whether or not Steps S32 to S34 have been performed with respect to all the process varying conditions specified in Step S31, similarly to Step S15 of the first embodiment. If Steps S32 to S34 have been completed for all the process varying conditions, the subsequent Step S36 are initiated. If Steps S32 to S34 have not been completed for all the process varying conditions, Steps S32 to S34 are performed again.

Next, in Step S36 (path delay analyzing step), at least two path delay times are calculated for a path between flip-flops of the cells in the target circuit by using the at least two variation delay times stored as the variation delay data D5.

Next, in Step S37 (maximum/minimum delay time output step), the variation delay time corresponding to the maximum or minimum one of the path delay times calculated in Step S36 is determined as a synthesized delay time which determines the operation characteristics of the target circuit and the synthesized delay time is stored as synthesized delay data D6.

Next, in Step S38 (logic simulation step), logic simulation of the target circuit is performed by using the synthesized delay time stored as the synthesized delay data D6 in order to verify whether or not the target circuit operates normally, similarly to Step S17 of the first embodiment.

Thus, the third embodiment achieves the following effect in addition to the effects achieved by the first embodiment.

Since the third embodiment calculates at least two path delay times for the path between the flip-flops by using at least two variation delay times, determines the variation delay time corresponding to the maximum or minimum one of the at least two path delay times as the synthesized delay time, and then performs the logic simulation of the target circuit by using the synthesized delay time, timing verification considering variation in path delay time resulting from process variation can be performed precisely and efficiently. Specifically, timing verification can be performed without unnecessarily increasing a margin in contrast to the case where the variation delay time composed of the cell delay time and the wire delay time each corresponding to the maximum or minimum amount of process variation is used for the logic simulation.

EMBODIMENT 4

A timing verifying method according to a fourth embodiment of the present invention, specifically a timing verifying method for verifying the operational timing of a target circuit will be described with reference to FIG. 8.

Figure 8:
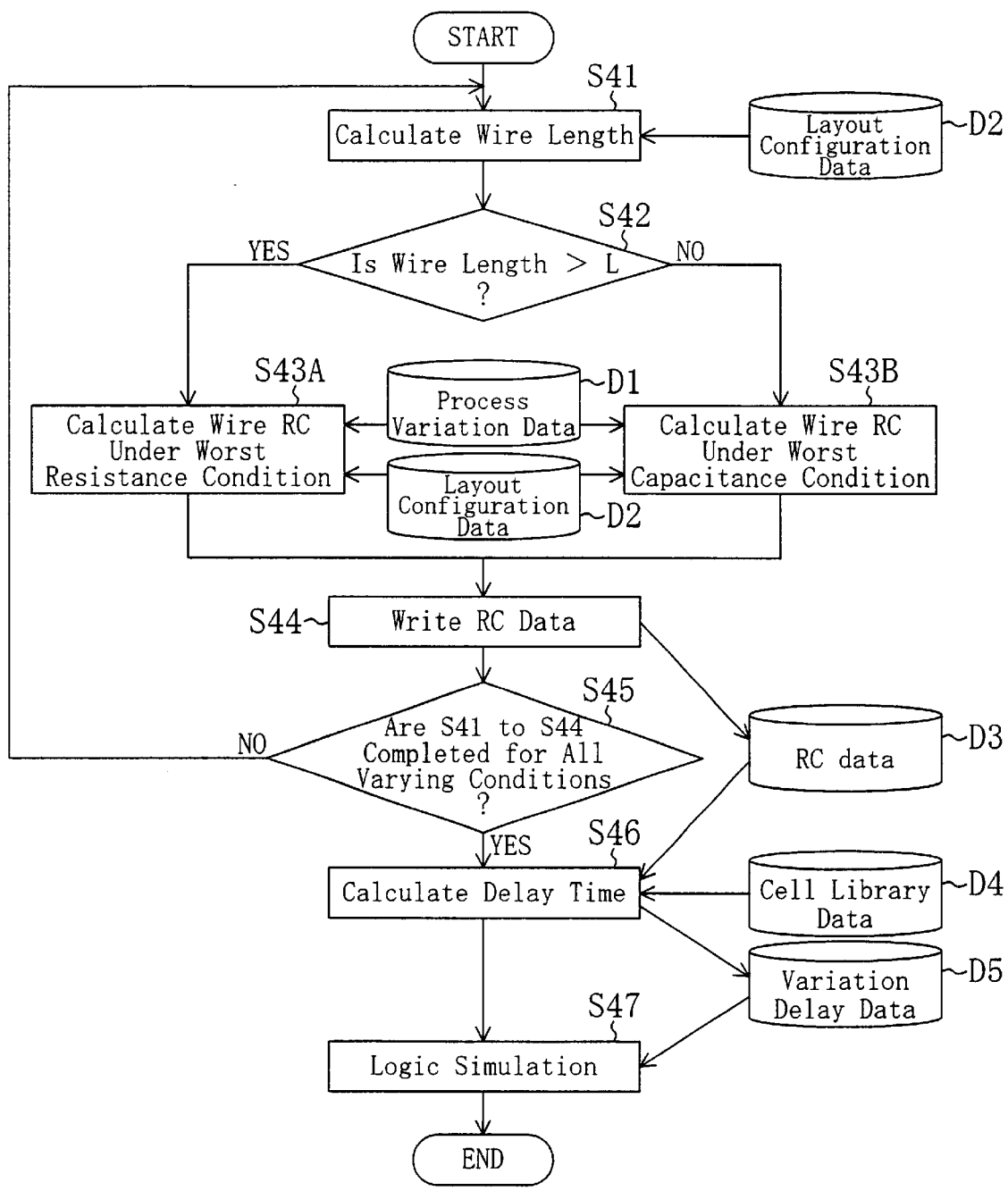
FIG. 8 is a flow chart of a timing verifying method according to a fourth embodiment of the present invention.

FIG. 8 is a flow chart of the timing verifying method according to the fourth embodiment.

First, in Step S41 (wire length calculating step), a layout configuration of wires (wires connecting cells) is read from layout configuration data D1 such that the length of each of the wires is calculated based on the layout configuration of the wires.

Next, in Step S42 (amount-of-variation setting step), it is judged whether or not the wire length calculated in Step S41 is larger than a specified value L such that an amount of process variation used to calculate wire resistance and wire-to-wire capacitance is read from the process variation data D1 based on the result of judgment.

Specifically, if the wire length is larger than the specified value L, the fourth embodiment sets the amount of process variation such that a larger variation is produced in the wire resistance than in the wire-to-wire capacitance, e.g., that the variation in the wire resistance becomes maximum. If the wire length is smaller than the specified value L, on the other hand, the fourth embodiment sets the amount of process variation such that a larger variation is produced in the wire-to-wire capacitance than in the wire resistance, e.g., that the variation in wire-to-wire capacitance becomes maximum.

A description will be given to the specified value L.

In general, a delay time T in a semiconductor integrated circuit (hereinafter referred to as a circuit delay time) is represented by $$T = T0 + \Delta T \times (Cg + Cwire) + R \times Cwire$$

(where T0 is a delay time intrinsic to a cell, $\Delta T$ is a load-dependent delay time per unit capacitance of the cell, Cg is terminal capacitance, Cwire is wire-to-wire capacitance, and R is wire resistance). In the foregoing equation, the cell delay time is represented by the part of $T0 + \Delta T \times (Cg + Cwire)$ and the wire delay time is represented by the part of $R \times Cwire$. If the wire length is relatively small, the circuit delay time T is dependent on Cwire (wire-to-wire capacitance). If the wire length is relatively large, the circuit delay time T is dependent on R (wire resistance).

In the fourth embodiment, therefore, a wire length when $\Delta T \times Cwire = R \times Cwire$ is satisfied is used as the specified value L.

Specifically, if $Cwire = K1 \times L$, $R = K2 \times L$ (where K1 and K2 are constants) are satisfied, $\Delta T \times K1 \times L = K2 \times L \times K1 \times L$ is derived therefrom so that $L = \Delta T/K2$ is satisfied. At this time, $\Delta T$ is dependent on the driving ability of the cell and the fourth embodiment uses, as the driving ability of the cell, an average driving ability of the cell used for logic synthesis or the like.

Next, in Step S43A (wire RC calculating step (if the wire length is larger than the specified value L), the layout configuration of the wires is read from layout configuration data D2 and the cross-sectional shape of the wire or the like is changed based on the amount of process variation set such that the wire resistance becomes maximum in Step S42, whereby the wire resistance and wire-to-wire capacitance are calculated under the worst resistance condition.

In Step S43B (wire RC calculating step (if the wire length is smaller than the specified value L), the layout configuration of the wires is read from the layout configuration data D2 and the cross-sectional shape of the wire or the like is changed based on the amount of process variation set such that the wire-to-wire capacitance becomes maximum in Step S42, whereby the wire resistance and wire-to-wire capacitance are calculated under the worst capacitance condition.

Next, in Step S44 (RC data writing step), the wire resistance and wire-to-wire capacitance calculated in Step S43A or Step S43B are stored as RC data D3.

Next, in Step S45 (reiterating step), it is judged whether or not Steps S41 to S44 have been performed with respect to all the wires in the target circuit. If Steps S41 to S44 have been completed for all the wires, the subsequent Step S46 is initiated. If Steps S41 to S44 have not been completed for all the wires, Steps S41 to S44 are performed again.

Next, in Step S46 (delay time calculating step), a wire delay time and a cell delay time are calculated by using the wire resistance and wire-to-wire capacitance stored in the RC data D3, the driving ability of the cell stored in cell library data D4, and the like, whereby the variation delay time composed of the wire delay time and the cell delay time is calculated and stored as variation delay data D5.

Next, in Step S47 (logic simulation step), logic simulation of the target circuit is performed by using the variation delay time stored as the variation delay data D5 in order to verify whether or not the target circuit operates normally.

Thus, the fourth embodiment sets the amount of process variation, i.e., the process varying condition based on the wire length, calculates the variation delay time corresponding to the process varying condition, and then performs the logic simulation of the target circuit by using the variation delay time. This allows the calculation of the variation delay time to be performed independently of the logic simulation of the target circuit and allows the logic simulation to be performed by using only the variation delay time corresponding to the process varying condition set based on the wire length. Since it is no more necessary to repeatedly perform logic simulation or circuit simulation with respect to the plurality of process varying conditions, timing verification considering process variation can be performed efficiently.

If the wire length is smaller than the specified value L, the fourth embodiment sets the amount of process variation such that a larger variation is produced in the wire-to-wire capacitance than in the wire resistance. If the wire length is larger than the specified value L, on the other hand, the fourth embodiment sets the amount of process variation such that a larger variation is produced in the wire resistance than in the wire-to-wire capacitance. This allows timing verification considering process variation to be performed precisely.

EMBODIMENT 5

A timing verifying method according to a fifth embodiment of the present invention, specifically a timing verifying method for verifying the operational timing of a target circuit will be described with reference to FIG. 9.

Figure 9:
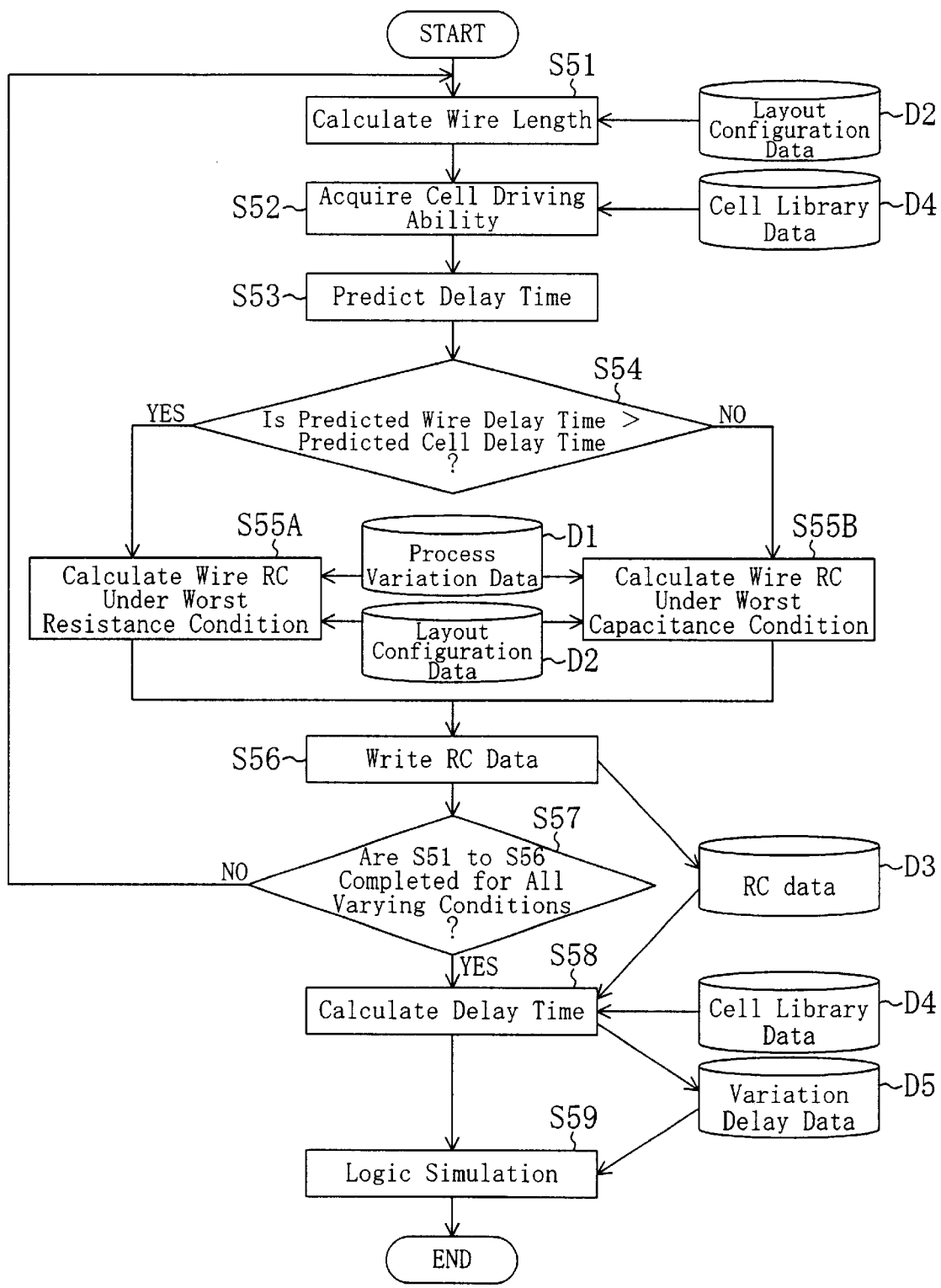
FIG. 9 is a flow chart of a timing verifying method according to a fifth embodiment of the present invention.

FIG. 9 is a flow chart of the timing verifying method according to the fifth embodiment.

First, in Step S51 (wire length calculating step), a layout configuration of wires (wires connecting cells) is read from layout configuration data D2 such that the length of each of the wires is calculated based on the layout configuration of the wires, similarly to Step S41 of the fourth embodiment.

Next, in Step S52 (cell driving ability acquiring step), the driving ability of the driving cell for driving each of the wires is acquired from cell library data D4.

Next, in Step S53 (delay time predicting step), a predicted cell delay time which is a predicted value of a cell delay time and a predicted wire delay time which is a predicted value of a wire delay time are calculated based on the wire length calculated in Step S51 and on the driving ability of the driving cell acquired in Step S52. At this time, mean capacitance per unit wire length used for logic synthesis or the like is used.

In contrast to the fourth embodiment which has set the amount of process variation based on the wire length, the fifth embodiment sets the amount of process variation based on the ordering relationship between the predicted cell delay time and the predicted wire delay time. This is because, if the predicted cell delay time is longer than the predicted wire delay time, the circuit delay time T (see EMBODIMENT 4) is dependent on Cwire (wire-to-wire capacitance), while the circuit delay time T is dependent on R (wire resistance) if the predicted wire delay time is longer than the predicted cell delay time.

That is, in Step S54 (amount-of-variation setting step), the ordering relationship between the predicted wire delay time and the predicted cell delay time is determined and, based on the result of determination, the amount of process variation used to calculate the wire resistance and the wire-to-wire capacitance is read from process variation data D1 to be set.

Specifically, if the predicted wire delay time is longer than the predicted cell delay time, the fifth embodiment sets the amount of process variation such that a larger variation is produced in the wire resistance than in the wire-to-wire capacitance. If the predicted cell delay time is longer than the predicted wire delay time, on the other hand, the fifth embodiment sets the amount of process variation such that a larger variation is produced in the wire-to-wire capacitance than in the wire resistance.

Next, in Step S55A (wire RC calculating step (if the predicted wire delay time is longer than the predicted cell delay time)), the layout configuration of the wires is read from the layout configuration data D2 and the cross-sectional shape of the wire or the like is changed based on the amount of process variation set such that a larger variation is produced in the wire resistance than in the wire-to-wire capacitance in Step S54, whereby the wire resistance and wire-to-wire capacitance are calculated under the worst resistance condition.

In Step S55B (wire RC calculating step (if the predicted cell delay time is longer than the predicted wire delay time)), the layout configuration of the wires is read from the layout configuration data D2 and the cross-sectional shape of the wire or the like is changed based on the amount of process variation set such that a larger variation is produced in the wire-to-wire capacitance than in the wire resistance in Step S54, whereby the wire resistance and wire-to-wire capacitance are calculated under the worst capacitance condition.

Next, in Step S56 (RC data writing step), the wire resistance and wire-to-wire capacitance calculated in Step S55A or Step S55B are stored as RC data D3.

Next, in Step S57 (reiterating step), it is judged whether or not Steps S51 to S56 have been performed with respect to all the wires in the target circuit. If Steps S51 to S56 have been completed for all the wires, the subsequent Step S58 is initiated. If Steps S51 to S56 have not been completed for all the wires, Steps S51 to S56 are performed again.

Next, in Step S58 (delay time calculating step), a wire delay time and a cell delay time are calculated by using the wire resistance and wire-to-wire capacitance stored in the RC data D3, the driving ability of the cell stored in cell library data D4, and the like, whereby the variation delay time composed of the wire delay time and the cell delay time is calculated and the variation delay time is stored as variation delay data D5.

Next, in Step S59 (logic simulation step), logic simulation of the target circuit is performed by using the variation delay time stored as the variation delay data D5 in order to verify whether or not the target circuit operates normally.

Thus, the fifth embodiment sets the amount of process variation, i.e., the process varying condition based on the predicted wire delay time and on the predicted cell delay time that have been predicted by using the wire length and the driving ability of the cell, calculates the variation delay time corresponding to the process varying condition, and then performs the logic simulation of the target circuit by using the variation delay time. This allows the calculation of the variation delay time to be performed independently of the logic simulation of the target circuit and allows the logic simulation to be performed by using only the variation delay time corresponding to the process varying condition that has been set based on the predicted wire delay time and the predicted cell delay time. Since it is no more necessary to repeatedly perform logic simulation or circuit simulation with respect to the plurality of process varying conditions, timing verification considering process variation can be performed efficiently.

If the predicted cell delay time is longer than the predicted wire delay time, the fifth embodiment sets the amount of process variation such that a larger variation is produced in the wire-to-wire capacitance than in the wire resistance. If the predicted wire delay time is longer than the predicted cell delay time, on the other hand, the fifth embodiment sets the amount of process variation such that a larger variation is produced in the wire resistance than in the wire-to-wire capacitance. This allows timing verification considering process variation to be performed precisely.

EMBODIMENT 6

A timing verifying method according to a sixth embodiment of the present invention, specifically a timing verifying method for verifying the operational timing of a target circuit will be described with reference to FIG. 10.

Figure 10:
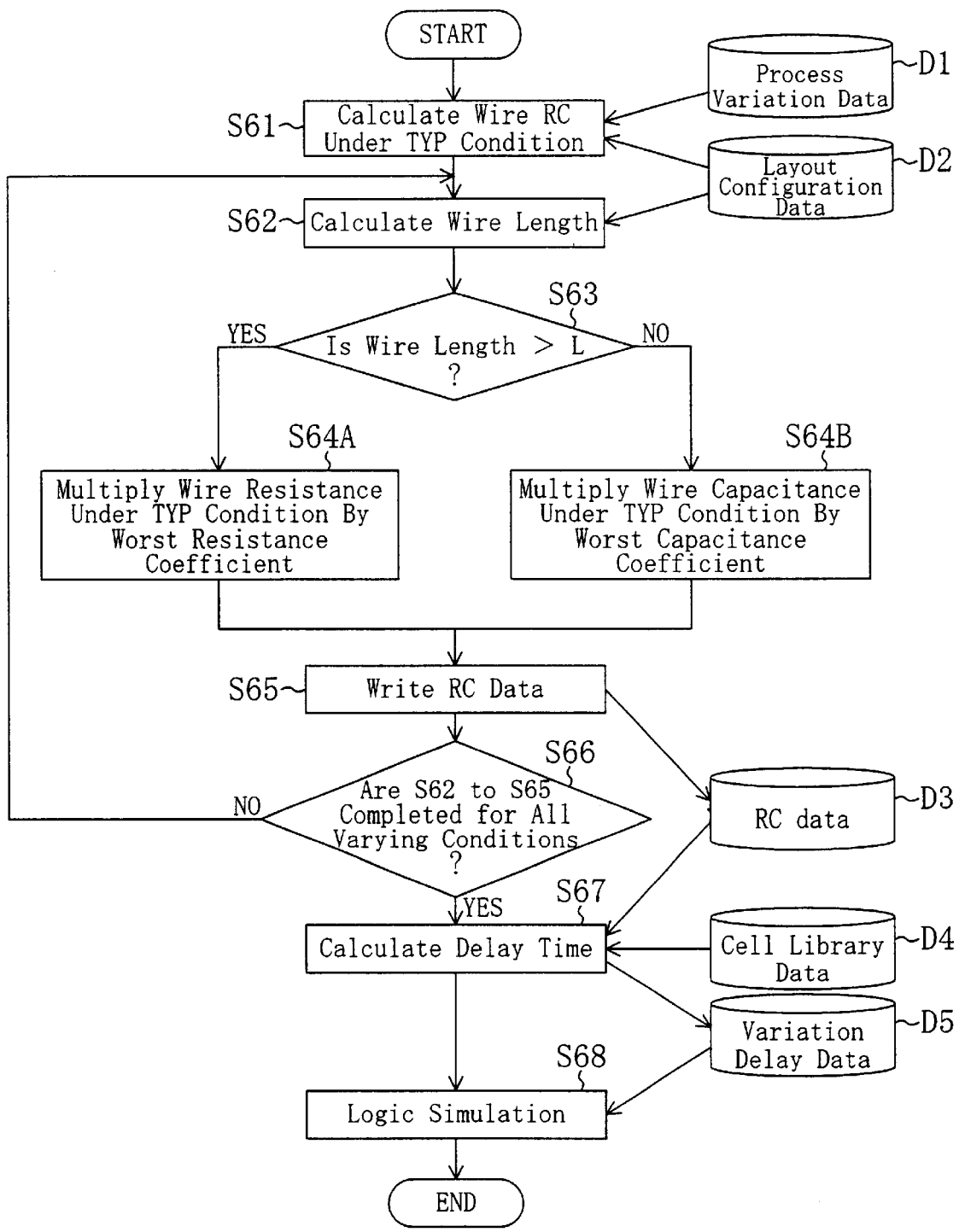
FIG. 10 is a flow chart of a timing verifying method according to a sixth embodiment of the present invention.

FIG. 10 is a flow chart of the timing verifying method according to the sixth embodiment.

First, in Step S61 (wire RC calculating step), a layout configuration of wires (wire connecting cells) is read from layout configuration data D2 and the cross-sectional shape of the wire or the like is changed based on data corresponding to the TYP condition (see EMBODIMENT 2) of process variation data D1, i.e., a mean amount of process variation, whereby the wire resistance and wire-to-wire capacitance corresponding to the TYP condition are calculated.

It the sixth embodiment, Step S61 is performed with respect to each of the wires in the target circuit.

Next, in Step S62 (wire length calculating step), the layout configuration of the wires is read from the layout configuration data D2 and then the length of each of the wires is calculated based on the layout configuration of the wires, similarly to Step S41 of the fourth embodiment.

Next, in Step S63, it is judged whether or not the wire length calculated in Step S62 is larger than the specified value L (see EMBODIMENT 4). If the wire length is larger than the specified value L, in Step S64A, the wire resistance corresponding to the TYP condition calculated in Step S61 is multiplied by a specified worst resistance coefficient such that the wire resistance increases. If the wire length is smaller than the specified value L, in Step S64B, on the other hand, the wire-to-wire capacitance corresponding to the TYP condition calculated in Step S61 is multiplied by a specified worst capacitance coefficient such that the wire-to-wire capacitance increases. Thus, Steps S63, S64A, and S64B constitute the wire RC adjusting step.

Next, in Step S65 (RC data writing step), the wire resistance or wire-to-wire capacitance adjusted in Step S64A or S64B is stored as RC data D3.

Next, in Step S66 (reiterating step), it is judged whether or not Steps S62 to S65 have been performed with respect to all the wires in the target circuit. If Steps S62 to S65 have been completed for all the wires, the subsequent step S67 is initiated. If Steps 62 to S65 have not been completed for all the wires, Steps S62 to S65 are performed again.

Next, in Step S67 (delay time calculating step), a wire delay time and a cell delay time are calculated by using the wire resistance and wire-to-wire capacitance stored in the RC data D3, the driving ability of the cell stored in cell library data D4, and the like, whereby a variation delay time composed of the wire delay time and the cell delay time is calculated and stored as variation delay data D5.

Next, in Step S68 (logic simulation step), logic simulation of the target circuit is performed by using the variation delay time stored as the variation delay data D5 in order to verify whether or not the target circuit operates normally.

Thus, the sixth embodiment calculates the wire resistance and wire-to-wire capacitance corresponding to the TYP condition, calculates the variation delay time by adjusting the wire resistance and wire-to-wire capacitance based on the wire length, and then performs the logic simulation of the target circuit by using the variation delay time. This allows the calculation of the variation delay time to be performed independently of the logic simulation of the target circuit and allows the logic simulation to be performed by using only the variation delay time calculated by adjusting the wire resistance and wire-to-wire capacitance corresponding to the TYP condition based on the wire length. Since it is no more necessary to repeatedly perform logic simulation or circuit simulation with respect to the plurality of process varying conditions, timing verification considering process variation can be performed efficiently.

If the wire length is smaller than the specified value L, the sixth embodiment increases the wire-to-wire capacitance corresponding to the TYP condition. If the wire length is larger than the specified value L, on the other hand, the sixth embodiment increases the wire resistance corresponding to the TYP condition. This allows timing verification considering process variation to be performed precisely.

Since the sixth embodiment calculates the wire resistance and wire-to-wire capacitance considering process variation by multiplying the wire resistance and wire-to-wire capacitance corresponding to the TYP condition by a specified coefficient based on the wire length, it is unnecessary to calculate the wire resistance and wire-to-wire capacitance by setting an amount of process variation for each of the wires based on the wire length. This allows timing verification considering process variation to be performed more efficiently.

What is claimed is:

1. A timing verifying method for verifying an operational timing of a semiconductor integrated circuit composed of a plurality of cells having logic functions, the plurality of cells being placed in the semiconductor integrated circuit and having respective terminals connected by wires, the method comprising:

a variation delay time calculating step of calculating at least two variation delay times by performing at least twice each of a first sub-step of setting, for a process varying factor which is determined by a process for fabricating the semiconductor integrated circuit and which varies at least one of resistance of each of the wires and capacitance between each of the wires and the wire adjacent thereto, an amount of process variation which is an amount of variation caused in the process varying factor, a second sub-step of calculating the resistance of the wire and the capacitance between the wires based on the amount of process variation and on a layout configuration of the wires, and a third sub-step of calculating a first delay time in the wire and a second delay time in the driving cell of the plurality of cells which drives the wire by using the resistance of the wire and the capacitance between the wires that have been calculated, while varying the amount of process variation, each of the at least two variation delay times being composed of the first delay time and the second delay time;

a delay data synthesizing step of generating a synthesized delay time which determines operation characteristics of the semiconductor integrated circuit based on the at least two variation delay times; and a logic simulation step of performing logic simulation of the semiconductor integrated circuit by using the synthesized delay time.

2. The timing verifying method of claim 1, wherein the delay data synthesizing step includes the step of determining, as the synthesized delay time, the maximum or minimum one of the at least two variation delay times.

3. The timing verifying method of claim 1, the method comprising, prior to the delay data synthesizing step, a mean variation delay time calculating step of calculating a third delay time in the wire and a fourth delay time in the driving cell by using the resistance of the wire and the capacitance between the wires that have been calculated based on a mean amount of process variation which is a mean amount of variation caused in the process varying factor and on the layout configuration of the wires and thereby calculating a mean variation delay time composed of the third delay time and the fourth delay time, wherein the delay data synthesizing step includes the steps of:

calculating a standard deviation of the at least two variation delay times by using the mean variation delay time; and determining a sum of the standard deviation and the mean variation delay time as the synthesized delay time.

4. The timing verifying method of claim 1, wherein the delay data synthesizing step includes the steps of:

calculating, for a path between flip-flops of the plurality of cells, at least two path delay times by using the at least two variation delay times, respectively; and determining, as the synthesized delay time, the variation delay time corresponding to a maximum or minimum one of the at least two path delay times.

5. A timing verifying method for verifying an operational timing of a semiconductor integrated circuit composed of a plurality of cells having logic functions, the plurality of cells being placed in the semiconductor integrated circuit and having respective terminals connected by wires, the method comprising:

a wire length calculating step of calculating a length of each of the wires based on a layout configuration of the wires;

an amount-of-variation setting step of setting, for a process varying factor which is determined by a process for fabricating the semiconductor integrated circuit and which varies at least one of resistance of each of the wires and capacitance between each of the wires and the wire adjacent thereto, an amount of process variation which is an amount of variation caused in the process varying factor based on the wire length;

a wire RC calculating step of calculating, based on the amount of process variation and on the layout configuration of the wires, the resistance of the wire and the capacitance between the wires;

a delay time calculating step of calculating a first delay time in the wire and a second delay time in the driving cell of the plurality of cells which drives the wire and thereby calculating a variation delay time composed of the first delay time and the second delay time; and a logic simulation step of performing logic simulation of the semiconductor integrated circuit by using the variation delay time.

6. The timing verifying method of claim 5, wherein the amount-of-variation setting step includes the step of setting the amount of process variation such that a variation larger than a variation produced in the resistance of the wire is produced in the capacitance between the wires if the wire length is smaller than a specified value and setting the amount of process variation such that a variation larger than a variation produced in the capacitance between the wires is produced in the resistance of the wire if the wire length is larger than the specified value.

7. A timing verifying method for verifying an operational timing of a semiconductor integrated circuit composed of a plurality of cells having logic functions, the plurality of cells being placed in the semiconductor integrated circuit and having respective terminals connected by wires, the method comprising:

a wire length calculating step of calculating a length of each of the wires based on a layout configuration of the wires;

a driving ability acquiring step of acquiring, from library data on the plurality of cells, a driving ability of the driving cell of the plurality of cells which drives the wire;

a delay time predicting step of calculating, based on the wire length and on the driving ability, a predicted wire delay time which is a predicted value of a delay time in the wire and a predicted cell delay time which is a predicted value of a delay time in the driving cell;

an amount-of-variation setting step of setting, for a process varying factor which is determined by a process for fabricating the semiconductor integrated circuit and which varies at least one of resistance of each of the wires and capacitance between each of the wires and the wire adjacent thereto, an amount of process variation which is an amount of variation caused in the process varying factor based on the predicted wire delay time and on the predicted cell delay time;

a wire RC calculating step of calculating, based on the amount of process variation and on a layout configuration of the wires, the resistance of the wire and the capacitance between the wires;

a delay time calculating step of calculating a first delay time in the wire and a second delay time in the driving cell by using the resistance of the wire and the capacitance between the wires that have been calculated and thereby calculating a variation delay time composed of the first delay time and the second delay time; and a logic simulation step of performing logic simulation of the semiconductor integrated circuit by using the variation delay time.

8. The timing verifying method of claim 7, wherein the amount-of-variation setting step includes the step of setting the amount of process variation such that a variation larger than a variation produced in the resistance of the wire is produced in the capacitance between the wires if the predicted cell delay time is longer than the predicted wire delay time and setting the amount of process variation such that a variation larger than a variation produced in the capacitance between the wires is produced in the resistance of the wire if the predicted wire delay time is longer than the predicted cell delay time.

9. A timing verifying method for verifying an operational timing of a semiconductor integrated circuit composed of a plurality of cells having logic functions, the plurality of cells being placed in the semiconductor integrated circuit and having respective terminals connected by wires, the method comprising:

a wire RC calculating step of calculating resistance of each of the wires and capacitance between each of the wires and the wire adjacent thereto based on a mean amount of process variation which is a mean amount of variation caused in a process varying factor which is determined by a process for fabricating the semiconductor integrated circuit and which varies at least one of the resistance of the wire and the capacitance between the wires and on a layout configuration of the wires;

a wire length calculating step of calculating a length of each of the wires based on the layout configuration of the wires;

a wire RC adjusting step of increasing the capacitance between the wires calculated in the wire RC calculating step if the wire length is smaller than a specified value and increasing the resistance of the wire calculated in the wire RC calculating step if the wire length is larger than the specified value;

a delay time calculating step of calculating a first delay time in the wire and a second delay time in the driving cell of the plurality of cells which drives the wire by using the resistance of the wire and the capacitance between the wires that have been adjusted in the wire RC adjusting step and thereby calculating a variation delay time composed of the first delay time and the second delay time; and a logic simulation step of performing logic simulation of the semiconductor integrated circuit by using the variation delay time.

* * * * *